United States Patent
de Menezes Pereira et al.

(10) Patent No.: US 9,319,029 B1
(45) Date of Patent: Apr. 19, 2016

(54) SYSTEM AND METHOD FOR AUTOMATIC FILTER TUNING

(71) Applicant: Clover Network, Inc., Mountain View, CA (US)

(72) Inventors: Arvind Antonio de Menezes Pereira, Sunnyvale, CA (US); Alvin Dominguez, San Jose, CA (US); Gary Wagner, Menlo Park, CA (US)

(73) Assignee: Clover Network, Inc., Mountain View, CA (US)

( * ) Notice: Subject to any disclaimer, the term of this patent is extended or adjusted under 35 U.S.C. 154(b) by 0 days.

(21) Appl. No.: 14/745,268

(22) Filed: Jun. 19, 2015

(51) Int. Cl.
*H04B 1/40* (2015.01)
*H03H 21/00* (2006.01)
*H03H 7/01* (2006.01)
*H03H 7/03* (2006.01)

(52) U.S. Cl.
CPC ......... *H03H 21/0001* (2013.01); *H03H 7/0115* (2013.01); *H03H 7/0138* (2013.01); *H03H 7/0153* (2013.01); *H03H 7/03* (2013.01); *H03H 7/17* (2013.01); *H03H 2021/0098* (2013.01)

(58) Field of Classification Search
CPC ........... H04B 5/00; H03H 7/0153; H03H 7/17
USPC ........ 455/41.1, 41.2, 77, 150.1, 191.1, 193.2, 455/213, 306, 307
See application file for complete search history.

(56) References Cited

U.S. PATENT DOCUMENTS

| | | | |
|---|---|---|---|
| 3,946,328 A | 3/1976 | Boctor | |
| 4,138,654 A * | 2/1979 | Luhowy | H03J 5/246 327/552 |
| 5,146,585 A * | 9/1992 | Smith, III | G06F 1/14 327/144 |
| 5,227,743 A | 7/1993 | Yamamoto | |
| 5,519,890 A * | 5/1996 | Pinckley | H04B 1/1036 370/484 |
| 5,917,387 A | 6/1999 | Rice et al. | |
| 5,923,174 A | 7/1999 | Darling | |
| 6,307,442 B1 | 10/2001 | Meyer et al. | |
| 6,307,443 B1 | 10/2001 | Gabara | |
| 7,761,067 B1 | 7/2010 | Tsai et al. | |
| 2003/0054783 A1 | 3/2003 | Mason et al. | |
| 2003/0171107 A1 | 9/2003 | Sorrells et al. | |

(Continued)

OTHER PUBLICATIONS

Pipilos et al., A Si 1.8 GHz RLC Filter with Tunable Center Frequency and Quality Factor, IEEE Journal of Solid State Circuits, vol. 31, n. 10, Oct. 1996, pp. 1517-1525.

(Continued)

*Primary Examiner* — Tuan Pham
(74) *Attorney, Agent, or Firm* — The Mueller Law Office, P.C.

(57) ABSTRACT

Various methods and devices that involve tuning filters are disclosed. A disclosed method for tuning a filter comprises trimming a center frequency of the filter. The method also comprises trimming an input signal magnitude of the filter. The method also comprises measuring a performance metric of the filter after trimming the center frequency of the filter and the input signal magnitude of the filter. The method also comprises repeating the trimming steps and the measuring step until the filter is tuned for a first physical test condition. A disclosed device that includes a filter also includes first and second trimming circuits that trim the center frequency and input signal magnitude of the filter. A disclosed system includes a motor to transfer a transmitting device from a first physical test condition to a second physical test condition relative to a proximity coupling device with a filter.

28 Claims, 13 Drawing Sheets

(56) References Cited

U.S. PATENT DOCUMENTS

| | | | |
|---|---|---|---|
| 2010/0156525 A1* | 6/2010 | Lim | H03H 11/1291 327/553 |
| 2011/0050364 A1 | 3/2011 | Achour | |
| 2012/0075039 A1 | 3/2012 | Guyette | |
| 2012/0218082 A1 | 8/2012 | DeLuca | |
| 2012/0274427 A1* | 11/2012 | Dubash | H04B 1/28 334/8 |
| 2013/0090073 A1 | 4/2013 | Zhu et al. | |
| 2014/0029481 A1 | 1/2014 | Manku et al. | |
| 2014/0038094 A1 | 2/2014 | Hamaguchi et al. | |
| 2014/0187153 A1 | 7/2014 | Zhu et al. | |
| 2014/0194055 A1 | 7/2014 | Jones | |
| 2015/0035612 A1 | 2/2015 | Maxim et al. | |
| 2015/0093987 A1 | 4/2015 | Ouyang et al. | |

OTHER PUBLICATIONS

Zahirovic, Automatic Integrated Filter Tuning Techniques, University of Waterloo, Ontario, Microwave Symposium Digest, 2012 IEEE MTT-S International, Jun. 2012, pp. 1-3.

* cited by examiner

SYSTEM AND METHOD FOR AUTOMATIC FILTER TUNING

BACKGROUND OF THE INVENTION

Filters serve as one of the pillars of the modern information age due to their ability to discern signals of a given frequency from ambient noise and other signals that occupy the same frequency at the same time. As such, filters are a key component of all wireless communication systems. Filters are also an essential component of numerous modern electrical systems beyond communication applications. Indeed, nearly every signal processing system needs some kind of filtering apparatus in order to select a desired signal out of the environment in which it operates.

Band pass, low pass, high pass, and band reject filters are designed to be selective to signals of a particular frequency range. A function that describes the nature of this selectivity is called the transfer function of the filter. Although a filter may have an effect on both the phase and magnitude of signals that pass through it, the transfer function of a filter is often best understood by considering these effects separately. FIG. 1 includes chart 100 which shows the magnitude portion of the transfer function of a band pass filter. The abscissa of chart 100 is frequency provided in units of hertz, and the ordinate is the magnitude of the transfer function of the filter. The band pass characteristic of the filter is illustrated by the fact that the peak of the transfer function 101 is at a frequency $f_x$, and the transfer function falls off rapidly in either direction. As a result, input signals at frequency $f_x$ will be emphasized by the filter relative to input signals at other frequencies. The range of signals that are emphasized by the filter are referred to as being in the pass band of the filter. In this single pass band filter, the frequency $f_x$ can be referred to as the center frequency of the filter.

The abscissa of chart 100 includes a reference indicator at frequency $f_x$ and a second reference indicator at a target frequency $f_T$. Target frequency $f_T$ is the desired center frequency for the filter. Non-idealities in the components, manufacturing process, and assembly process used to produce a filter will cause deleterious shifts in the transfer function of the filter. These non-idealities are nearly impossible to avoid even with the use of expensive low variance devices. However, filters can be tuned to adjust for these non-idealities. As illustrated in FIG. 1, the trimming procedure could result in a shift of the transfer function as indicated by arrow 102 to cause the pass band of the filter to shift from $f_x$ to $f_T$.

FIG. 1 also includes a basic block diagram of a trimming circuit. The block diagram includes filter 103, filter input 104, filter output 105, and trimming circuit 106. The transfer function or center frequency may be tuned by changing the electrical characteristics of one or more of the filter components. Filter 103 is tuned to maximize the ratio of the wanted signals to the unwanted signals such that the output at 105 has a much higher signal-to-noise ratio than that at the input 104. This process is usually conducted by "trimming" the electrical characteristic of a component of the filter such as its capacitance in order to alter the transfer function of the filter.

SUMMARY OF INVENTION

In one embodiment, a method for tuning a filter is provided. The method comprises trimming a center frequency of the filter. The method also comprises trimming an input signal magnitude of the filter. The method also comprises measuring a performance metric of the filter after trimming the pass band frequency of the filter and the input signal magnitude of the filter. The method also comprises repeating the trimming steps and the measuring step until the filter is tuned for a first physical test condition.

In another embodiment, a device is provided. The device comprises a receiver. The device also comprises a filter that filters an input signal for the receiver. The device also comprises a first trimming circuit that trims a center frequency of the filter. The device also comprises a second trimming circuit that trims an input signal magnitude for the filter.

In another embodiment, a system is provided. The system comprises a filter in a proximity coupling device. The system also comprises a first trimming circuit for the filter. The system also comprises a test device with: (i) a holder for a transmitting device; and (ii) a set of motor(s) to transfer the holder from a first physical test condition to a second physical test condition. The system also comprises a first control system with a performance metric feedback path. The first control system is in operative communication with the first trimming circuit. The system also comprises a second control system in operative communication with the motor(s) and the first control system.

DETAILED DESCRIPTION OF THE EMBODIMENTS

Figure 1:
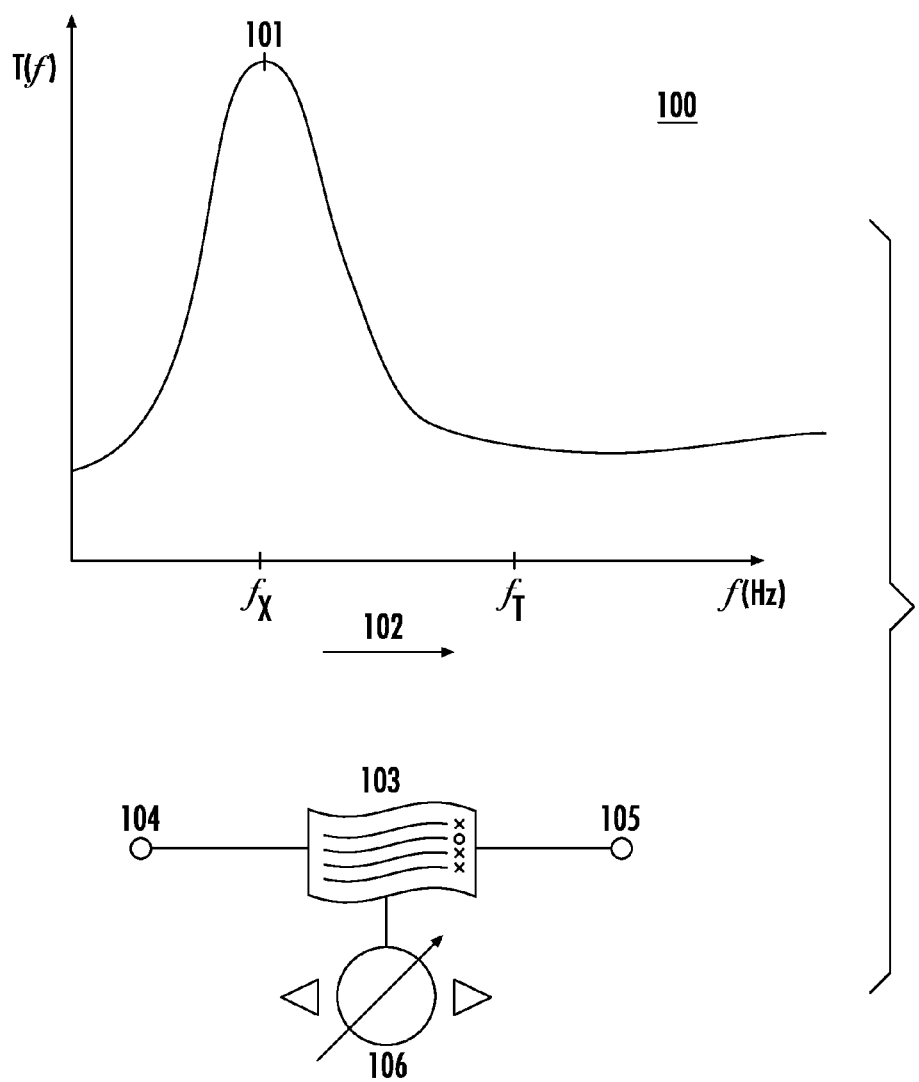
FIG. 1 illustrates a transfer function of a band pass filter as the filter is tuned in accordance with related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

The following detailed description describes various approaches for tuning filters via the disclosure of particular devices, systems, and methods. Some of these approaches involve trimming the pass band frequency and input signal magnitude of the filter. In particular approaches trimming is conducted after the filter has been physically manufactured. As such, particular approaches involve trimming a filter either as a final step in the manufacturing process of that product or to tune the filter after it has been in use for a period of time in order to recalibrate the filter to its initial manufactured condition. Specific approaches for trimming the pass band and input signal magnitude of the filter are described below with reference to FIGS. 3-8. Some other approaches described below involve systems and methods for tuning a filter once the filter has been integrated into a manufactured product. Specific approaches for trimming a filter in a manufactured product are described below with reference to FIGS. 8-11. Some other approaches described below involve systems and methods for tuning a filter under different physical test conditions. Such approaches are described below with reference to FIGS. 12-13.

Taken alone or in any combination, the approaches described below enable the production of highly sensitive and accurately tuned filters that are widely applicable to any communication system. However, some of the approaches described below specifically enable communication systems in which a received or transmitted signal would otherwise be too difficult to manage reliably given the relative strength of the signal compared to background noise and the narrow band in which the signal was located.

A particular filter application that is aided by the approaches described herein is the front end filter for a proximity inductive coupling device. More narrowly, the approaches described herein are conducive to trimming a filter of a near field communication (NFC) receiver or transceiver. Indeed, the utilization of approaches described in this specification contribute to the enablement of a reliable manufacturing line for producing products that are able to conduct NFC protocols through a display, such as a liquid crystal display or touch screen display, that meet industry standards for NFC communication via chip cards. In particular, these approaches contribute to the enablement of a reliable manufacturing line for producing proximity inductive coupling devices that meet various standards for the operation of integrated circuit cards wherein the proximity inductive coupling device's (PCD) transceiver and the proximity integrated circuit chip (PICC) communicate through a display.

Figure 2:
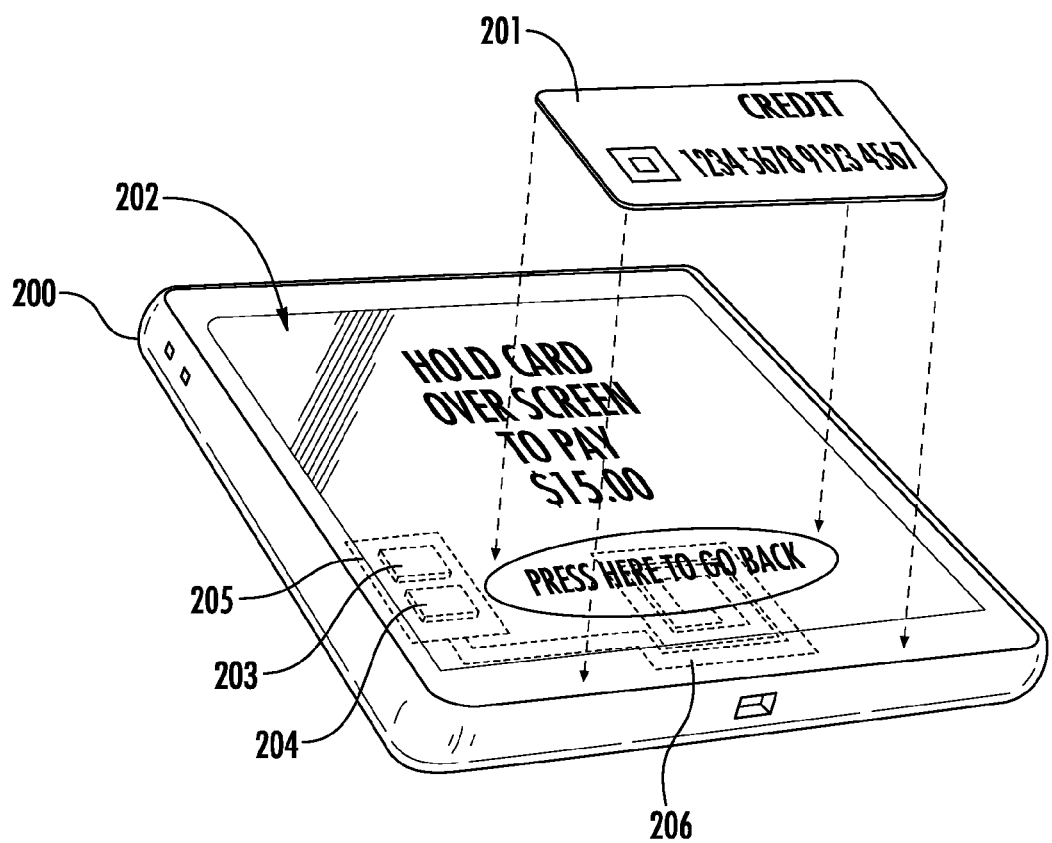
FIG. 2 illustrates a PCD reader operating through a display to read a PICC.

FIG. 2 is an illustration of a PCD 200 communicating with a PICC 201 through a display 202 in order to more clearly define the form of communication towards which the approaches described herein contribute towards enabling. In this illustration, PCD 200 is a point of sale terminal with a transceiver 203, a filter 204 located on an integrated circuit 205, and an antenna 206. As illustrated, PICC 201 and PCD 200 communicate through the display 202 because the integrated circuit 205 is located beneath the display within an area encompassed by the surface of the display. The display 202 can be a touch screen that is responsive to a stylus or direct touch contact from a user via capacitive, resistive, optical, infrared, acoustic, or any other touch technology. The display 202 can utilize LCD, LED, CRT, or any other display technology.

The illustrated application of FIG. 2 provides a particularly amendable environment in which to recognize the benefits of the approaches disclosed herein. NFC communication through a display requires a particularly sensitive filter because the return signal from the PICC has to be transmitted back through the screen. The screen severely attenuates the magnetic field that exists between the NFC device and the card in both directions. As such, the filter used to pick up signals that return from the PICC to the PCD must be very sensitive. Furthermore, specific contactless communication protocol specifications, have stringent requirements for the physical conditions under which the device must work. In particular, specifications directed to the reliable handling of sensitive payment related information put additional strain on the PCD and its required ability to receive and process transmitted signals.

NFC is also an illustrative example for the benefits of some of the approaches disclosed herein because NFC places stringent requirements on the filtering components of an NFC receiver. In the specific application of NFC detection, the filter transfer function is meant to pass signals at the upper sideband of a signal and filter out the carrier signal. The modulation scheme for the signal could use amplitude shift keying modulation, modified miller modulation, phase shift keying modulation, as well as various other known modulation schemes. In a specific NFC application, the carrier frequency is 13.56 MHz and the upper sideband is 14.4 MHz. One important filter parameter is known as the quality factor, or "Q," of the filter. Q is a measurement of the narrowness of the filter's pass band relative to the center frequency at that band. A pass band filter that needs to screen signals that are 840 kHz apart at a frequency of 14.4 MHz is a relatively high-Q filter. Given the high Q required to screen a high frequency carrier signal from its sideband signal, such as screening a 14.4 MHz from a signal at 13.56 MHz, the filter transfer function needs to be extremely precise. Precise filter components can improve the accuracy of the center frequency of a filter, but the precision of a lot of filter components is directly proportional to the cost of the lot such that relying on only the most precise components for a filter design is expensive. Also, since the slightest variation from the design specifications will have a deleterious effect on the operation of the filter in NFC through display applications, additional steps should be taken to tune the filters on a device-by-device basis.

Throughout the specification, reference will be made back to the particular application of NFC communication, and more particularly to NFC communication through a display. However, approaches described herein are more generally applicable to any kind of filtering system and are not limited to the specific application of NFC communication.

Filter Parameter Trimming

Filter parameters can be trimmed after a filter has been constructed through the use of trimming circuitry. Trimming circuitry can be deployed in a device and alter the electrical characteristics of the device in response to control signals. The control signals could be from a code stored in non-volatile memory on the device, output from a control circuit on the device, or output from an external control circuit utilized in a manufacturing process to trim the device as one of the final steps of that process. In the case of filters, the electrical characteristics of the device are altered in order to tune the filter parameters. Filter parameters include the amount of power consumed by the filter, the locations of the poles and zeroes of the filter's transfer function (e.g. the frequency of and attenuation of the stop bands and pass bands of the filter), the output signal magnitude of the filter, the input signal magnitude of the filter, and various other parameters.

Figure 3:
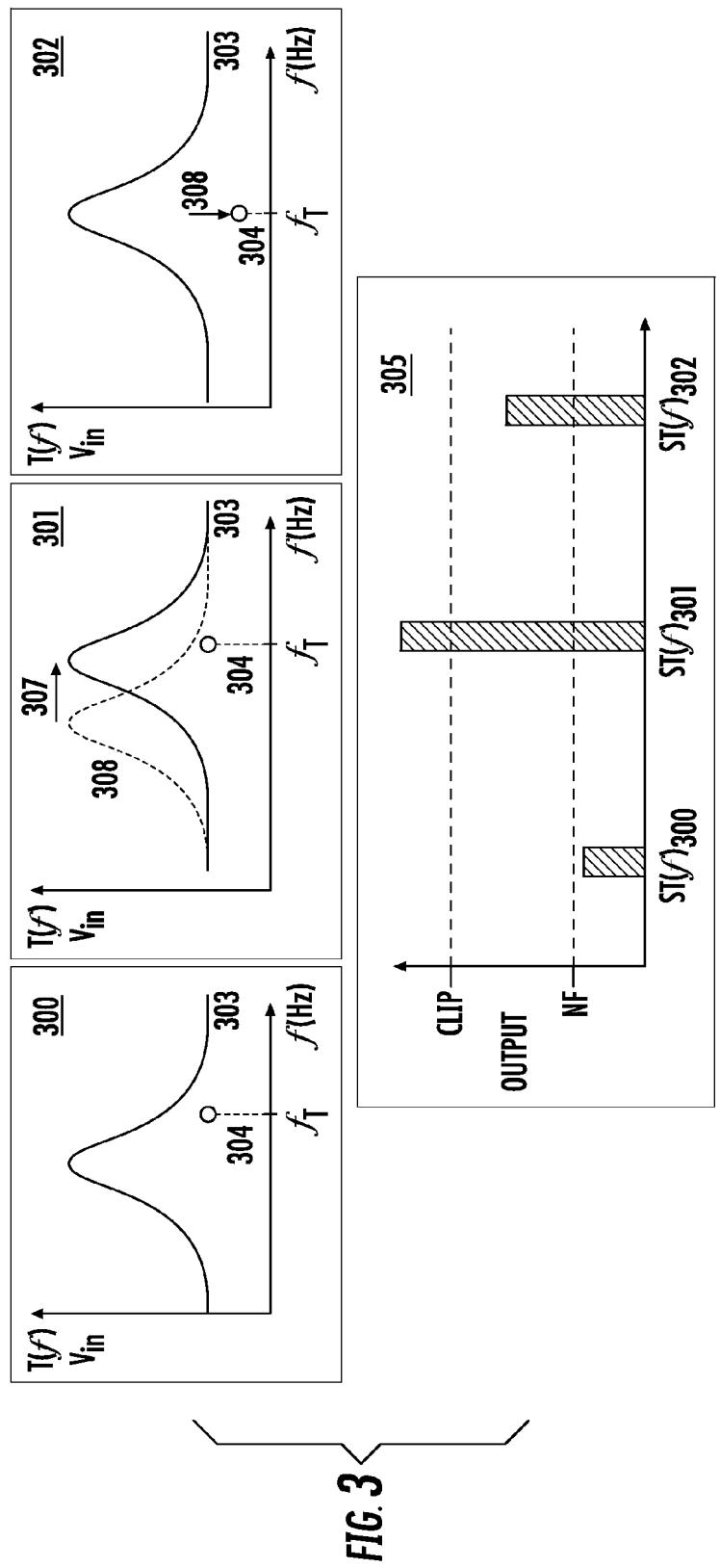
FIG. 3 illustrates various charts that describe the effect of a filter tuning procedure.

FIG. 3 illustrates exemplary benefits of trimming two particular filter parameters in combination: the pass band frequency of the filter and the input signal magnitude of the filter.

Charts 300, 301, and 302 illustrate the transfer function 303 of a pass band filter with input signal 304 overlain on the axes. The abscissa of charts 300, 301, and 302 is frequency in units of hertz, and the ordinate is the magnitude effect of the transfer function of the filters. Chart 305 illustrates the output of a filter with transfer function 303 in each of charts 300, 301, and 302 given input signal 304. Accordingly, chart 305 is a bar graph where each entry along the abscissa represents the conditions in chart 300, 301, and 302 from left to right with the ordinate being the magnitude of the filtered output signal generated from filtering input signal 304. The ordinate includes two reference lines marked "Clip" and "NF." The "Clip" reference line indicates the level at which the filter is overloaded and information is lost through the filtering process. The noise floor (NF) reference line indicates the level at which the filter cannot properly discern the input signal from ambient noise.

FIG. 3 illustrates a trimming procedure that trims the pass band frequency of the signal in charts 300 and 301, and then trims the input signal magnitude in charts 301 and 302. With reference to chart 300, the pass band of transfer function 303 in chart 300 is not aligned with the desired center frequency of the filter. In the case of transfer function 303, there is only one pass band such that the peak of the pass band can be referred to as the center frequency of the transfer function. In FIG. 3, the desired center frequency is marked on the abscissa of charts 300, 301, and 302 by reference line $f_T$. The desired center frequency is set by the frequency of the input signal 304. Transfer function 300 may have been designed to have a center frequency at $f_T$, but the center frequency shifted when implementing the filter. These shifts may have been caused due to the use of non-ideal components and the introduction of additional parasitic elements due to the assembly of the filter in the final product that houses the filter. Input signal 304 passes through filter transfer function 303 in chart 300 to produce an output signal that can be described as $ST(f_T)_{300}$. The magnitude of this signal is displayed in chart 305 as the first entry on the abscissa of that chart. Because transfer function 303 in chart 300 is not properly aligned with the frequency of input signal 304, the resulting output $ST(f_T)_{300}$ is below reference line NF, and the filter cannot adequately discern input signal 304 from ambient noise.

In chart 301, transfer function 303 has been trimmed to adjust the center frequency from that of the original transfer function. The original transfer function from chart 300 is shown in phantom lines as transfer function 306 in chart 301. The degree by which the filter was trimmed is illustrated by reference arrow 307. This trimming can be conducted using a trimming circuit that alters the electrical characteristics of the filter. For example, the trimming circuit can alter the impedance of a reactive component whose value determines the center frequency of the filter. Now that the pass band of transfer function 303 is aligned with $f_T$, the resulting output $ST(f_T)_{301}$ in chart 305 is well above the noise floor. Although the resulting signal can now be quite clearly discerned from ambient noise, the magnitude of the filtered signal is so large that the filter is overloaded and information is lost through a phenomenon referred to as "clipping." As such, the filter is still not behaving in an optimal fashion after the first trimming procedure has been conducted. Indeed, the first trimming procedure eliminated one source of error while causing another.

With reference to chart 302, the input signal magnitude of input signal 304 has been adjusted downwards as indicated by reference arrow 308 to compensate for the trimming of the center frequency shown by reference arrow 307 of chart 301. This second trimming procedure can again be conducted using a trimming circuit that alters an electrical component of the filter. As such, there is no need to tune the transmitting device and all trimming can be handled by altering the characteristics of the filter locally. For example, the trimming circuit can alter the impedance of a component in a voltage or current divider that sets the input signal magnitude as seen by the filter. In other words, the signal received from the antenna will be the same, but a trimming circuit will attenuate the magnitude of that signal before it becomes the input signal of the filter. Now that the input signal magnitude has been adjusted downwards, the resulting output $ST(f_T)_{302}$ in chart 305 is within the range of values that the filter can properly handle. The filtered signal that is created from this input signal can then be processed by the device of which the filter is a part, without loss of information or interference from ambient noise.

As illustrated, trimming both the pass band and input signal magnitude of the filter provides a greater degree of control over the filter and allows the filter to be tuned from well outside the range of what a traditional filter architecture could achieve. Notably, the trimming procedure used to alter the input signal magnitude in chart 302 does not have a first order effect on the shape of transfer function 303. As a result, the two parameters can be trimmed independently. This provides a significant benefit over related approaches in which the parameters cannot be independently adjusted. Trimming both parameters effectively decouples trimming for filter overload and interference from noise. If such parameters are not decoupled, and only one is trimmed, a designer may be required to settle for a suboptimal trim in which the center frequency is not perfectly aligned with the input signal so that the filter is not overloaded, but the input signal is not properly emphasized with respect to background noise.

Figure 4:
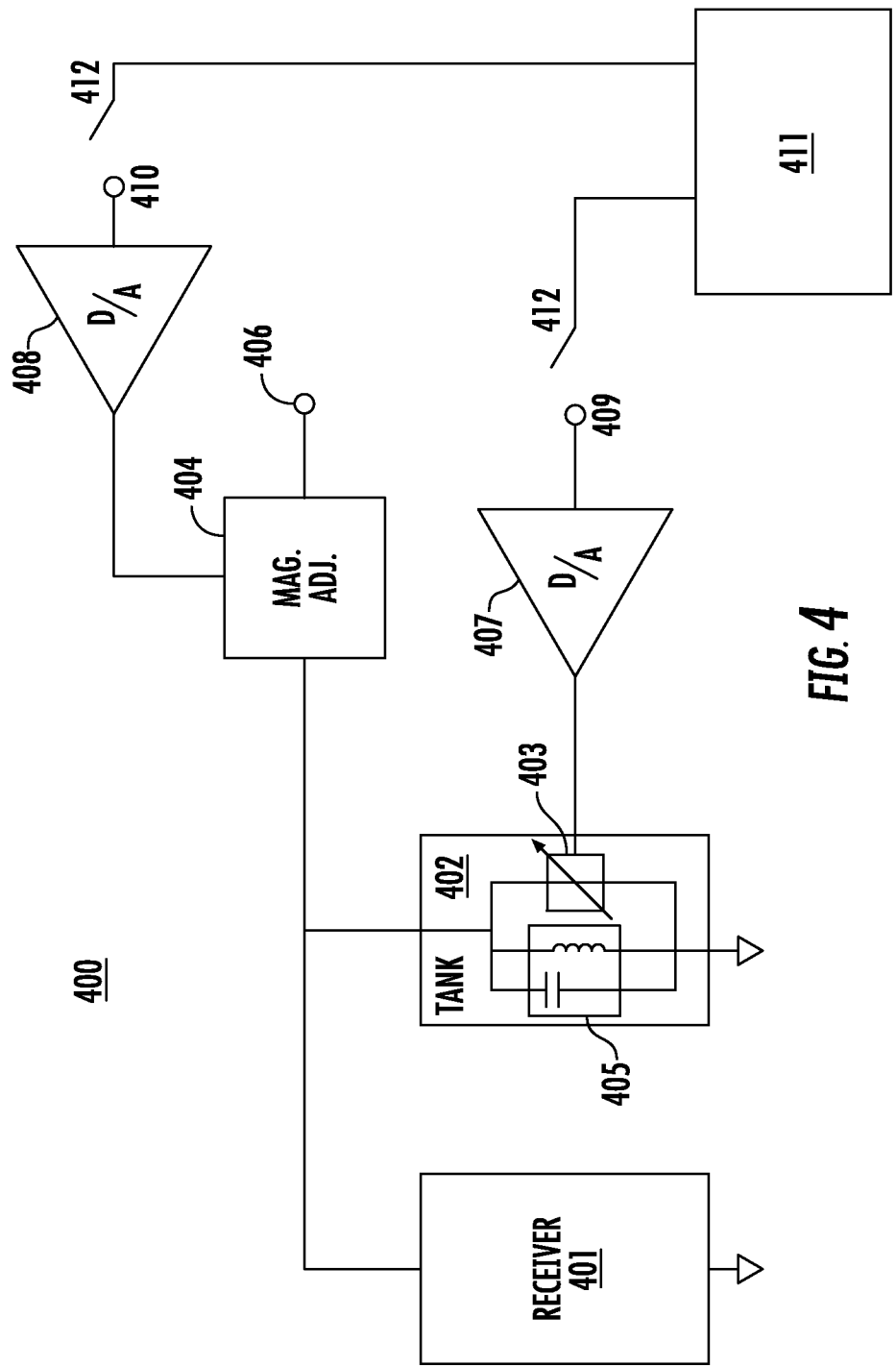
FIG. 4 illustrates a block diagram of a device with a tunable filter.

FIG. 4 illustrates a block diagram of a device 400 that comprises a receiver 401, a filter 402, a first trimming circuit 403, and a second trimming circuit 404. In some approaches, filter 402 can include an LC tank 405 that determines the pass band frequency of filter 402. Filter 402 filters an input signal received at input node 406 for receiver 401. The illustrated components of device 400 can all be components of a single integrated circuit or can be system level components such as board level passives and chip set components on a printed circuit board. Although filter 402 and receiver 401 are drawn as having direct connections to second trimming circuit 404 to illustrate the operation of an LC tank filter 405, receiver 401 could be isolated from second trimming circuit 404 via filter 402 if other filter architectures were used in place of filter 402.

A class of devices represented by device 400 allows the pass band and input signal magnitude of their component filters to be independently tuned. The first trimming circuit 403 trims a pass band frequency of filter 402 while the second trimming circuit 404 trims an input signal magnitude for filter 402. As illustrated, the first trimming circuit 403 includes an adjustable reactance, such as an adjustable capacitance or inductance, placed in parallel with LC tank 405. As such, when the reactance of trimming circuit 403 alters, the pass band of filter 402 is concomitantly altered. The second trimming circuit 404 alters the magnitude of the input signal seen by filter 402. The second trimming circuit 404 can also include an adjustable reactance. In either the first or second trimming circuits, the adjustable capacitance can be provided via a varactor that responds to an analog control signal or a capacitor bank that responds to a digital control signal. In device 400, the input signal is a single ended voltage signal such that the input signal magnitude of filter 402 is the magnitude of a voltage applied across filter 402. For example, the input signal magnitude may be the magnitude of a root means squared voltage applied across filter 402 to ground at a particular frequency. However, the input signal magnitude could be a current signal or could be a peak-to-peak value in situations where the input filter and input signal are differential circuits. As illustrated, second trimming circuit 404 does not have a first order effect on the transfer function of filter 402.

The trimming circuits of a tunable filter can be controlled in various ways. As illustrated in FIG. 4, the trimming circuits can be controlled by digital to analog converters (DACs) such as first DAC 407 and second DAC 408. The DACs allow a digital code to trim the filter. In addition, either trimming circuit can be controlled directly via the input of a code delivered from a controller. For example, the trimming code may be an input to a variable capacitor bank such that it sets the number of capacitors connected between the two signal nodes of the bank. In particular, a general purpose input output (GPIO) pin can be used to provide the code to the trimming circuit. The codes can be supplied via an external control signal applied to nodes 409 and 410. Alternatively or in combination, the codes can be supplied from a memory 411 that is also a component of device 400. For example, memory 411 can be a form of nonvolatile memory such as EEPROM or flash memory. In addition, device 400 can include switches 412 to alter the source of the trim codes that are supplied to DACs 407 and 408 from an external source to an internal source. As such, the filter can be trimmed through the aid of an external control circuit to determine the optimal trim codes during a manufacturing or calibration process, and then those trim codes can be stored in memory 411 to be utilized when the device is deployed for use in the field where the external source is no longer available.

Figure 5:
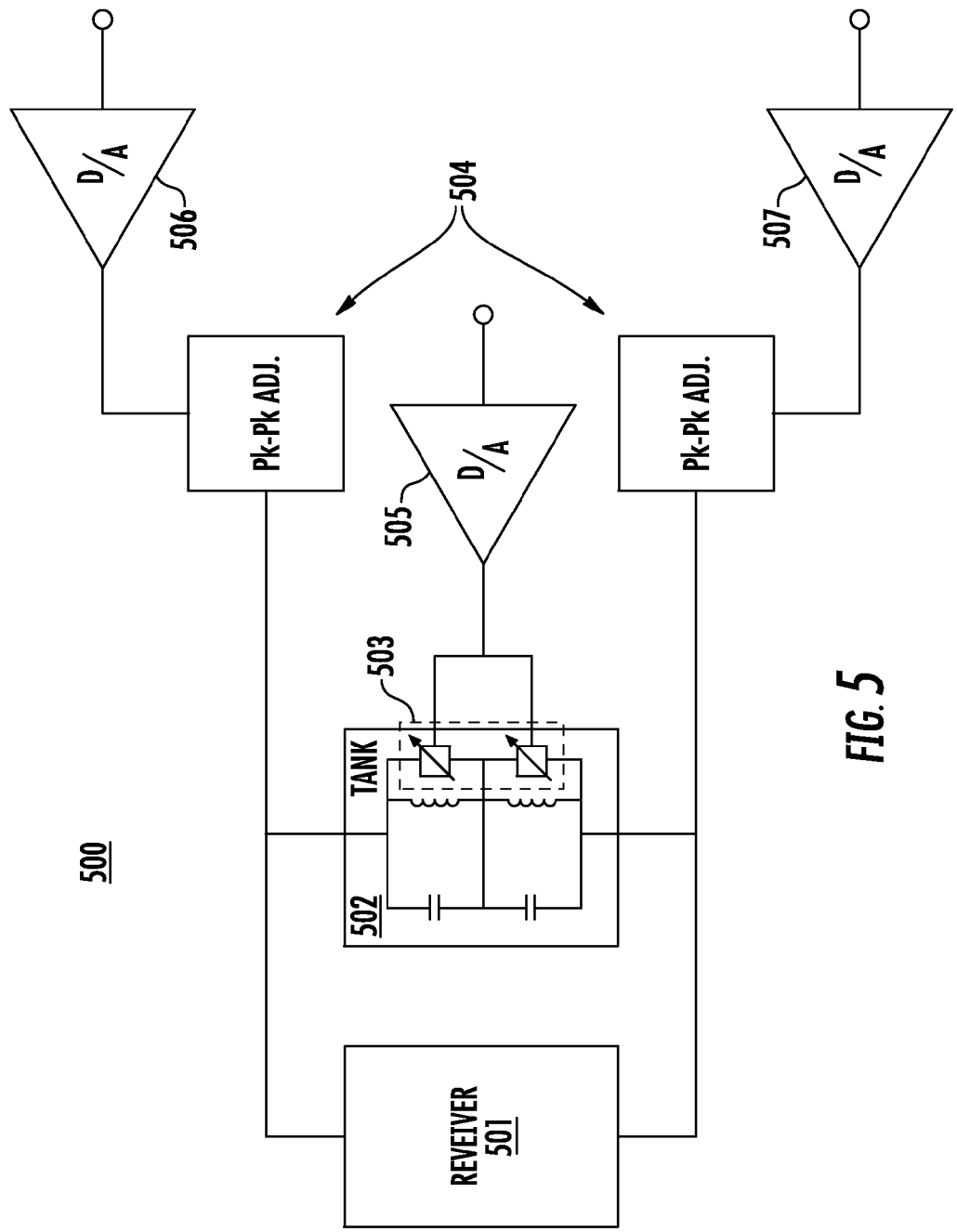
FIG. 5 illustrates a block diagram of a device with a differential tunable filter.

Device 400 is a single-ended system, but the approaches disclosed herein are equally applicable to differential systems. Indeed, FIG. 5 illustrates an embodiment of a device 500 that utilizes a differential receiver 501 and differential filter 502. As illustrated, filter 502 is an LC tank filter with a first trimming circuit 503 and a second trimming circuit 504. In the differential approach, first trimming circuit 503 comprises two adjustable impedances and second trimming circuit 504 comprises two input signal magnitude adjustment circuits. These trimming circuits 504 are labeled peak-to-peak adjust because, in a differential system, trimming the input signal magnitude comprises trimming the peak-to-peak magnitude of the input signal as opposed to trimming the magnitude of the signal with respect to ground. The trimming circuits in device 500 can again be controlled by DACs such as DACs 505, 506, and 507. In certain approaches the two peak-to-peak adjustment circuits 504 can be controlled by a single DAC.

Figure 6:
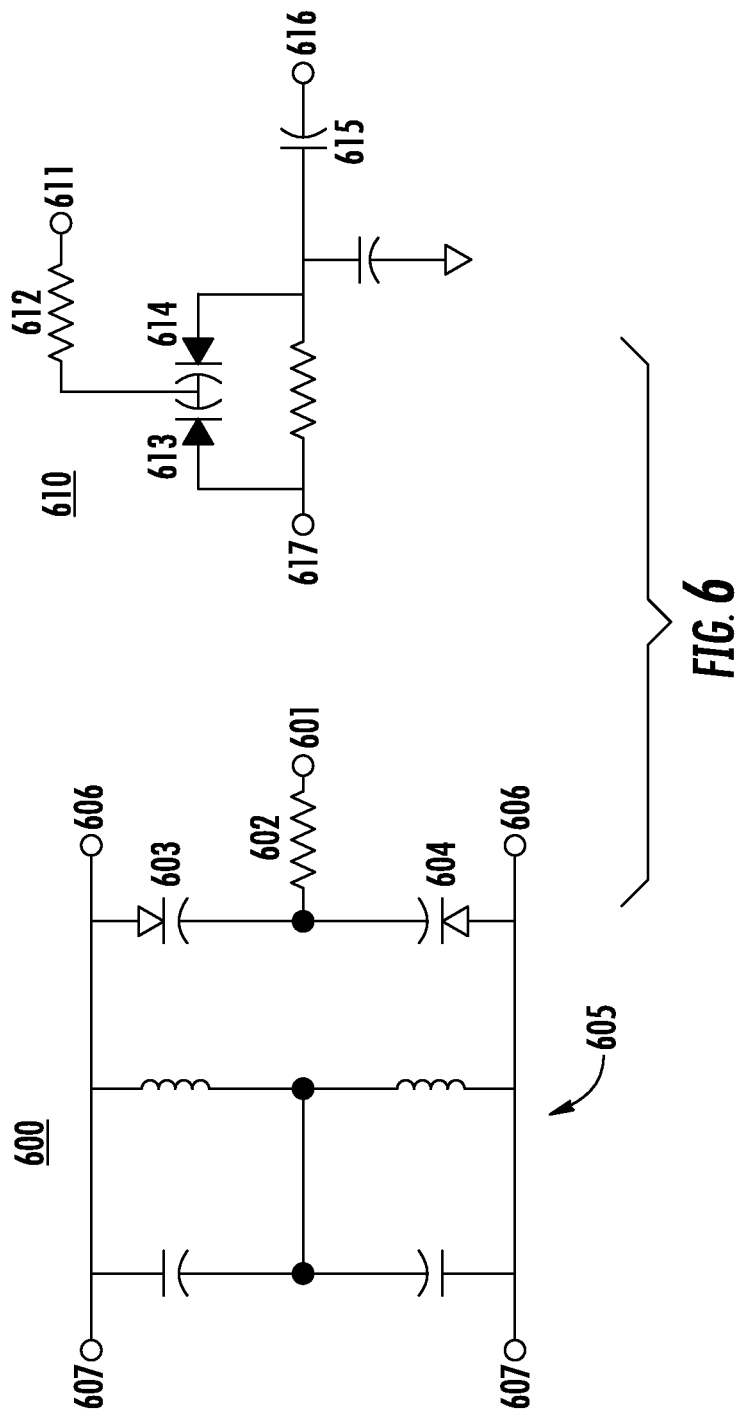
FIG. 6 illustrates a pair of circuit schematics utilizing varactors that can be used in combination with the block diagrams of FIGS. 4 and 5.
Figure 7:
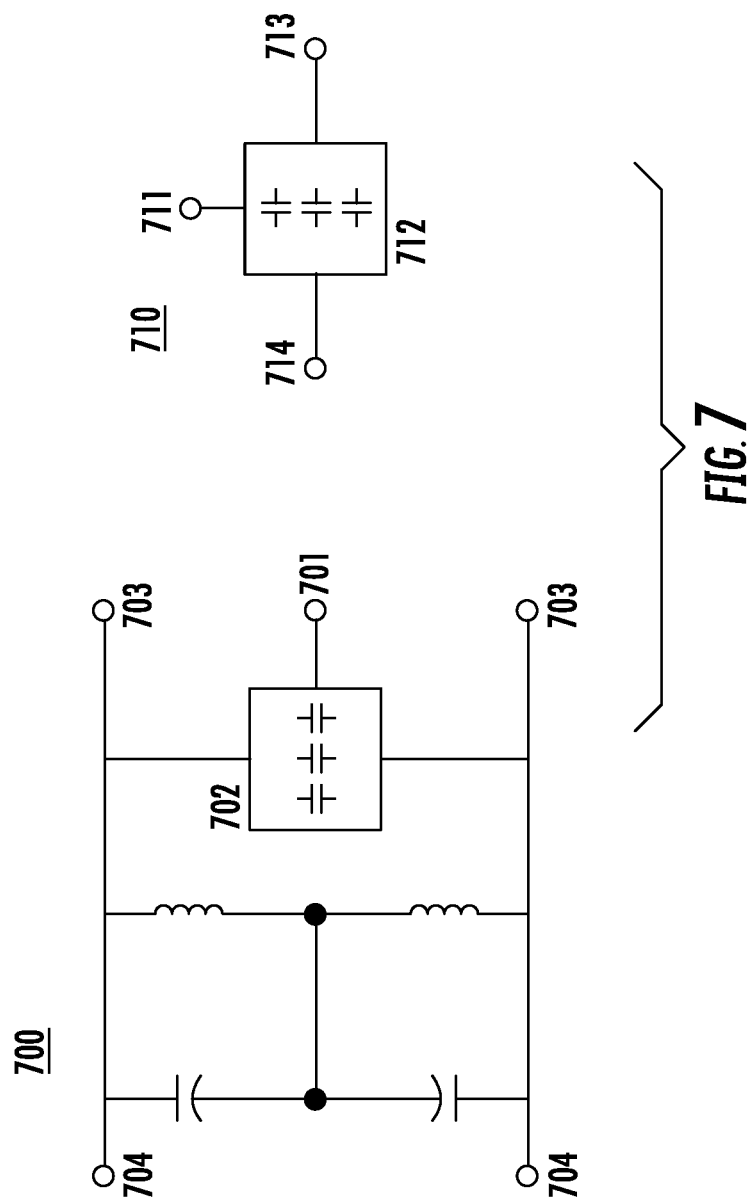
FIG. 7 illustrates a pair of circuit schematics utilizing variable capacitor banks that can be used in combination with the block diagrams of FIGS. 4 and 5.

Specific implementations of the trimming circuits discussed above can be described with reference to FIGS. 6 and 7. In general, the trimming circuits of FIG. 6 are driven through the application of an analog voltage and hence may require a DAC to change a digital control signal into the required analog voltage. Contrarily, the trimming circuits of FIG. 7 are driven through the direct application of a digital signal that sets the capacitance that appears across the nodes of the trimming circuit. Any combination of the circuits in FIGS. 6 and 7 can be applied in place of circuits 503 and 504 in FIG. 5, and circuits 403 and 404 in FIG. 4. However, the DACs in FIGS. 4 and 5 will not be utilized in combination with the circuits of FIG. 7. The combination of using circuit 600 for tuning the pass band frequency of the filter and circuit 710 for trimming the input signal magnitude is particularly appealing because the input signal magnitude does not generally need to be trimmed with as much granularity as the pass band frequency. Furthermore, if a standard microcontroller is used to provide the trimming signals to the trimming circuits, it is beneficial to utilize trimming circuits that respond to digital signals that can be sent via a GPIO pin because D/A outputs are a scarce commodity in many board level systems that utilize standard microcontrollers.

Circuit 600 can be used in place of the first trimming circuit 503 in FIG. 5, while a single ended version of circuit 600 could be used in place of the first trimming circuit 403 in FIG. 4. The circuit 600 includes an analog voltage input 601 that is coupled to a high frequency blocking resistor 602 and two varactor diodes 603 and 604. In accordance with the illustrated configuration, the varactor diodes are biased by the voltage applied to input 601 to alter the capacitive load they place on input nodes 606. As a result, the LC value of the overall filter 605 changes to thereby change the center frequency of the filter and the quality of the signal passed on to output nodes 607.

Circuit 610 can be used in place of the second trimming circuits 404 and 504 in FIGS. 4 and 5. The circuit 610 includes an analog voltage input 611 that is again coupled to a high frequency blocking resistor 612 and two varactor diodes 613 and 614. In accordance with the illustrated configuration, the varactor diodes 613 and 614 serve as part of an adjustable voltage divider because their values alter the amount by which capacitive voltage divider 615 attenuates a signal received on input node 616 and output on node 617.

Circuit 700 can be used in place of the first trimming circuit 503 in FIG. 5, while a single ended version of circuit 700 could be used in place of the first trimming circuit 403 in FIG. 4. However, circuit 700 would not require DAC 407 or DAC 505. The circuit 700 includes a digital signal input 701 that is coupled to a variable capacitor bank circuit 702. The variable capacitor bank circuit 702 can be provided in a standalone integrated circuit. The digital signal input 701 could be connected to a GPIO pin on a controller that is located on the same board as circuit 700. The capacitor bank circuit 702 alters the number of capacitors that are connected across its signal inputs in response to the digital signal that is received on digital signal input 701. As a result, the LC value of circuit 700 changes to thereby change the center frequency of the filter and the quality of the signal passed on from input nodes 703 to output nodes 704.

Circuit 710 can be used in place of the second trimming circuits 404 and 504 in FIGS. 4 and 5. Circuit 710 includes a digital signal input 711 that is coupled to a variable capacitor bank circuit 712. The digital signal input 711 could be connected to a GPIO pin on a controller that is located on the same board as circuit 710. Like variable capacitor bank circuit 702, variable capacitor bank circuit 712 alters the number of capacitors that are connected across its signal inputs in response to the digital signal that is received on digital signal input 711. The capacitor bank 712 serve as part of an adjustable voltage divider because its capacitance alters the amount by a signal received on input node 713 is attenuated as it appears on output on node 714.

Figure 8:
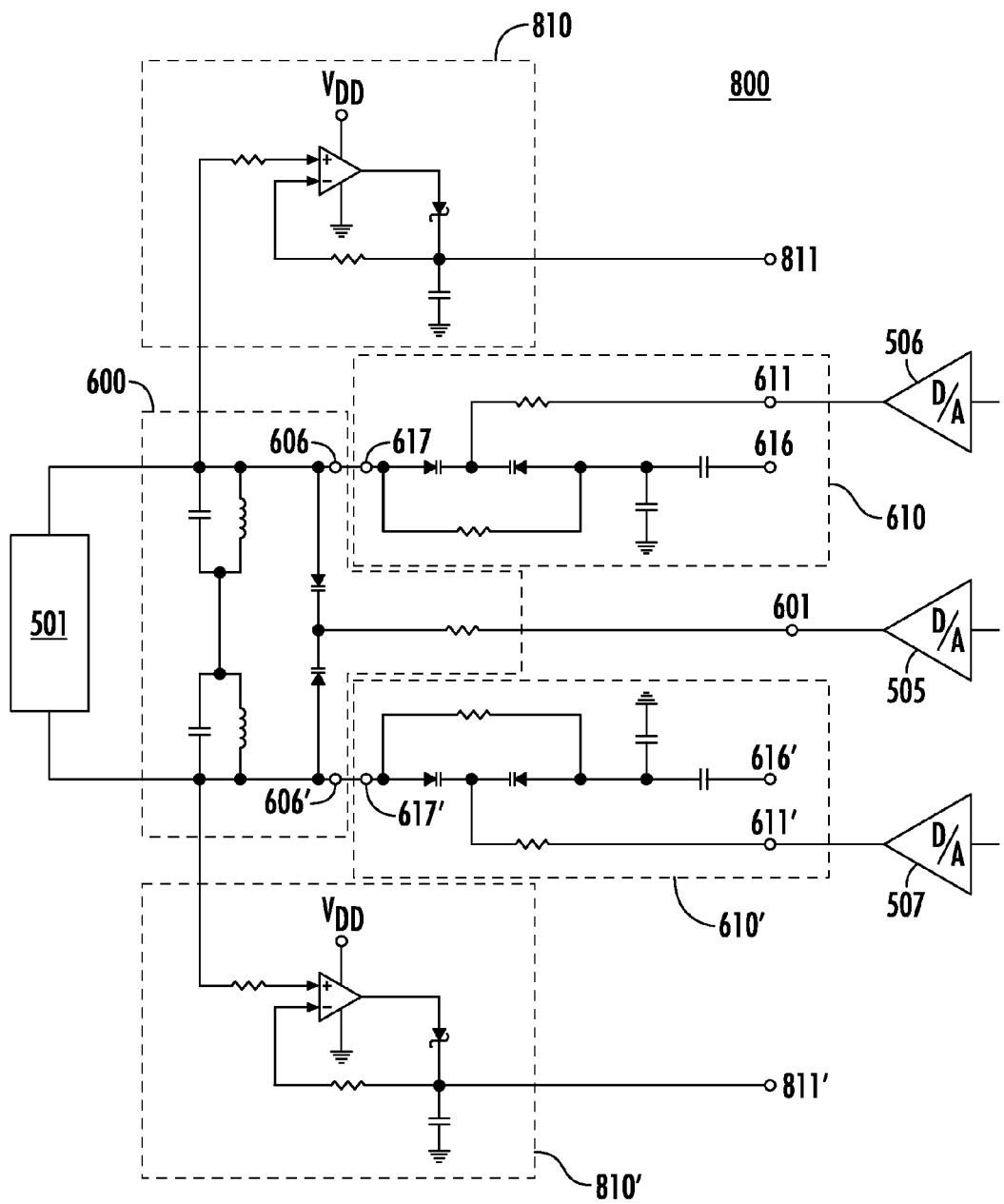
FIG. 8 illustrates a circuit schematic for the block diagram of FIG. 5.

FIG. 8 illustrates a device 800 that includes the detailed implementations of trimming circuits 600 and 610 to illustrate how those circuits are utilized in a device such as device 500. Like reference numerals from FIGS. 5 and 6 are utilized in FIG. 8 with the exception that the additional instantiation of circuit 610, necessitated by the differential nature of device 500, is marked using single quotes to distinguish circuit 610' from circuit 610. Device 800 also includes a voltage sampling circuit 810 that samples the analog voltage applied to the filter and routes that sampled voltage to an analog to digital converter via node 811. Since device 800 is differential, it requires another voltage sampling circuit. As with circuit 610, this additional circuit 810' is distinguished using a single quote. A single ended system would only require one of these circuits 810 or 810'. The analog voltage generated by circuits 810 and 810 can be used as part of the control loop described below in the next section. Note that although the trimming circuits in FIG. 8 utilize varactors, either or both trimming circuits could be replaced with alternative adjustable reactance circuits such as a capacitor bank circuit or variable inductance circuit.

Tuning System and Method for a Physical Test Condition

Specific methods and systems for tuning filters are disclosed as follows with reference to FIGS. 9-10. The devices that are tuned using these methods and systems can be in accordance with the devices disclosed above. The methods and systems generally refer to trimming a filter for one particular physical test condition. However, the methods and systems can be utilized in other approaches in which the same filter is tuned for a plurality of physical test conditions as described in the following section.

Figure 9:
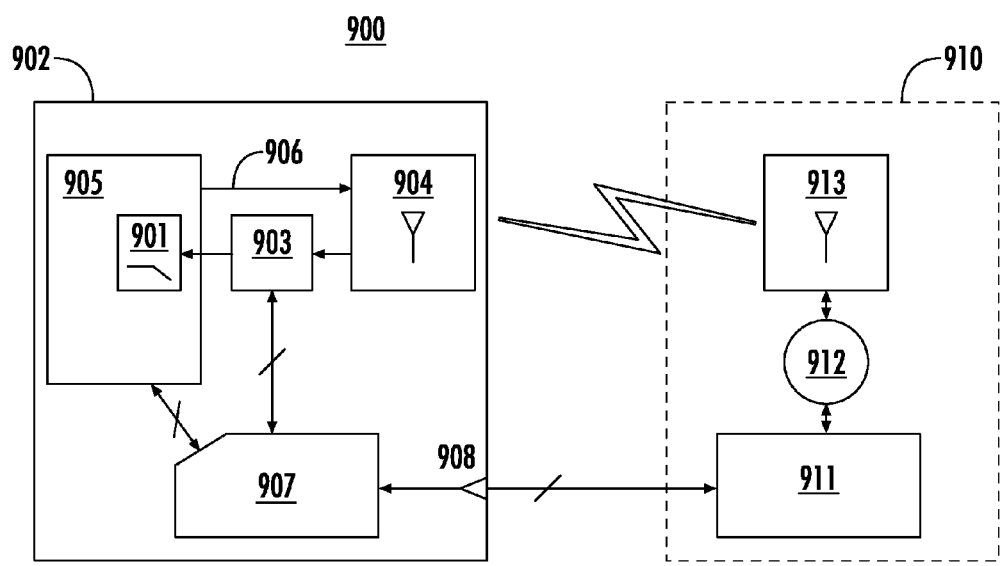
FIG. 9 illustrates a block diagram of a system for tuning a filter.

FIG. 9 illustrates a block diagram of a system 900 for tuning a filter 901 in a device 902. Device 902 can be a PCD. However, the device 902 can also be any communications device that utilizes a filter. In a particular example, system 900 can be a PCD such as a POS terminal capable of conducting NFC communication through a display. However, system 900 can also be any electronic device such as a smart phone or tablet that is capable of conducting wireless communication with an external system. More broadly, the device can be any device that communicates across a physical channel that requires a filter in order for the receiving device to ascertain the informational content of signals sent along that physical channel. Filter 901 filters an input signal received by device 902 on an antenna 904 for receiver 905. As drawn, receiver 905 includes a transmit path 906 back to antenna 904 and can therefore serve as a transceiver comprising a receiver and a transmitter. Receiver 905 can include a processing circuit that generates a digital signal based on a filtered signal generated by filter 901. For example, receiver 905 can be an NFC communication receiver that is configured to generate digital signals based on a filtered signal generated by filter 901 by filtering an input signal received on antenna 904. The digital signal can be the signal utilized by device 902 to process signals received from external systems. As drawn, filter 901 is shown as being physically part of receiver 905. However, these components do not have to be part of a single chip and can instead be separate units such as separate components of a printed circuit board.

Device 902 includes a trimming circuit 903 for tuning filter 901. Trimming circuit 903 lies between device antenna 904 and transceiver chip 905. Trimming circuit 903 can be any of the trimming circuits described above with reference to FIGS. 3-8. For example, trimming circuit 903 can include a first trimming circuit configured to trim the pass band of the filter such as first trimming circuit 403 or 503. In addition, trimming circuit 903 can include a second trimming circuit configured to trim the input signal magnitude of the filter such as second trimming circuit 404 or 504.

Trimming circuit 903 is illustrated as being connected to control circuit 907. Control circuit 907 can include the DACs and ADCs described above with reference to FIGS. 3-8. As such, the line connecting tuning circuit 903 and control circuit 907 is bidirectional because it can receive analog signals from tuning circuit 903 to measure the operating condition of the filter or filter parameters such as those generated by circuit 810, as well as sending analog signals to trimming circuit 903 such as the analog inputs to trimming circuits 403, 503, 404, or 504. Control circuit 907 can be a microcontroller. Control circuit 907 can also provide the required code needed to set the capacitance provided by a variable capacitance bank such as variable capacitance banks 702 and 712. For example, control circuit 907 can be a microcontroller with a GPIO pin for communicating with a variable capacitance bank in trimming circuit 903. In addition, control circuit 907 can communicate with receiver 905. In certain approaches, control circuit 907 can generate the digital signal mentioned above that allows device 902 to process signals received from antenna 904. As such, control circuit 907 can have dual responsibilities as part of the system used to trim device 902 as well as being the main processing component of device 902 when it is deployed. In these approaches, receiver 905 will be a more basic device and may have responsibilities limited to pulling the input signal to a base band while leaving the higher level open systems interconnection (OSI) processing to control circuit 907.

System 900 includes an external control system 910 that includes an external control circuit 911, a signal generator 912, and a transmitting device 913. The transmitting device 913, such as an antenna, can send test signals to antenna 904 as part of a procedure for trimming filter 901. The signal generator 912 can generate signals in order for the transmitting device 913 to emulate various communication devices and communication protocols. External control circuit 911 is part of a performance metric feedback path for tuning filter 901.

System 900 tunes filter 901 through the use of control loops and a performance metric feedback path. Through the use of these two control loops, external control system 910 is able to tune filter 901 such that device 902 performs adequately for a communication protocol selected by controller 911 and implemented by signal generator 912. For example, external control system 910 could trim device 902 to optimally tune for a weak signal sent from a PICC in accordance with a performance corner of a contactless communication specification. The feedback for these control loops can be any performance metric that relates to the goodness of reception for device 902.

The first control loop can be referred to as the test signal control loop. External control system 910 transmits test signals to device 902 from antenna 913 to antenna 904. The test signals are sent under the guidance of control circuit 911. This is the control path of the first control loop. Control circuit 911 is also able to detect performance of filter 901 based on its knowledge of the test signals it sent to device 902. Control circuit 911 detects the performance of filter 901 via a performance metric feedback path which includes the physical connection drawn between port 908 on device 902 and external control system 910.

The second control loop can be referred to as the trim control loop. System 900 includes a second control loop in that external control system 910 is capable of altering the trim codes of device 902 to thereby tune filter 901. This represents another control loop because external control system 910 can control the characteristics of filter 901 and receive feedback regarding how the filter performed in response. The connection through port 908 is illustrated as being bidirectional to illustrate both a portion of the performance metric feedback path and the trim control path for the trim control loop. However, in some embodiments system 900 can include two separate connections between device 900 and external control system 910 where one includes the performance metric feedback path and the other includes the trim control path.

As mentioned, external control circuit 911 can communicate with device 902 via a port 908 to receive performance metric measurements from the device, or to send commands to the device to trim filter 901. Port 908 can be a simple digital signal output port. Port 908 can also be an input for an external control signal. In some approaches, port 908 will allow for bidirectional communication and accommodate both kinds of signals. In any of those approaches, control circuit 907 can be a processing circuit that is in operative communication with the filter and that generates a digital signal output for external control circuit 911. For example, control circuit 907 can receive data from receiver 905 indicating that a signal was properly received by the filter and can generate a "pass" signal to send back to control system 911 to indicate that the filter was properly tuned for a given test signal provided to device 902. As another example, control circuit 907 can receive a signal from trimming circuit 903 that provides information about the filtered signal, can process the signal into a digital signal that describes the characteristics of the filtered signal, and can then pass this signal back to control system 911. As a final example, control circuit 907 can receive a digital signal from a processing circuit in receiver 905 and simply act as a pass through for that signal on its way back to control system 911.

As mentioned, control system 911 can also send commands to device 902 to trim filter 901. To this end, control system 911 can be in operative communication with trimming circuit 903. This operative communication can be achieved through an external control signal on input port 908. In specific approaches, control system 911 will be in independent communication with two separate trimming circuits in trimming circuit 903 such as trim circuit 503 and trim circuit 504.

Figure 10:
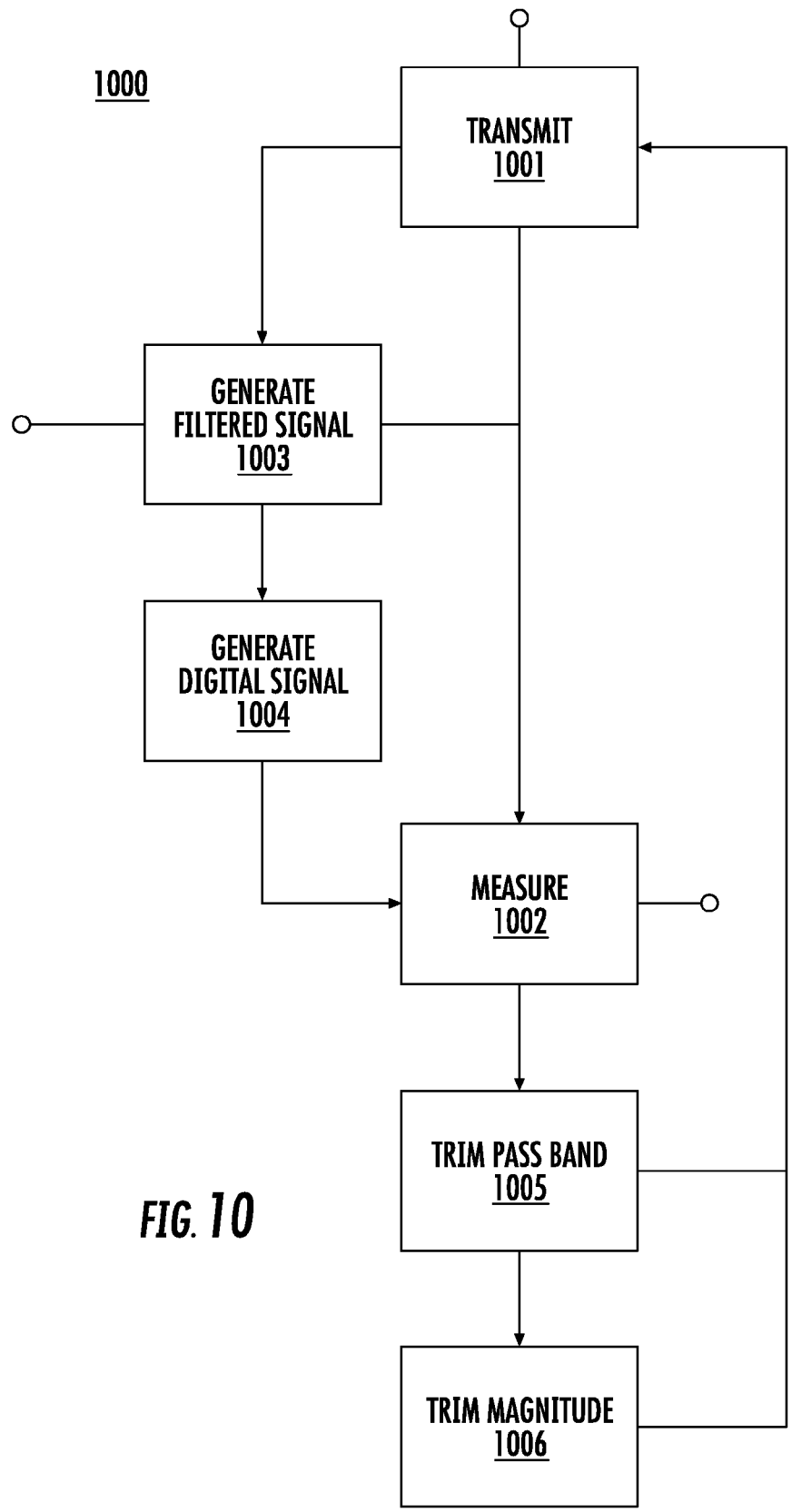
FIG. 10 illustrates a flow chart of a set of methods for tuning a filter.

FIG. 10 illustrates a flow chart 1000 that can be used to describe several methods for tuning a filter using a system such as system 900. Flow chart 1000 includes a transmitting step 1001 in which a first test signal is transmitted to device 200 of FIG. 2, which can be referred to as the device under test. With reference to system 900, step 1001 could comprise the transmission of an external test signal from antenna 913 to antenna 904. External control circuit 911 could allow signal generator 912 and various antennas 913 to simulate the behavior of a large number of radio protocols such as Wi-Fi, Bluetooth, ZigBee, or any form of proximity inductive coupling based communication protocol. External control circuit 911 could be a computer and signal generator 912 could be a standard multi-function signal generator such that nearly any communications protocol could be emulated by system 900 in order for system 900 to tune filters for devices capable of communicating using multiple communications protocols or to tune different devices using the same test equipment.

In a particular example, external control system 910 could emulate the transfer of information between a PICC and a PCD. Signal generator 912 could allow antenna 913 to send a signal as if it were responding to a signal sent from a PCD via antenna 904 without device 902 having to send out the initial call for a PICC to respond to. However, signal generator 912 could also allow antenna 913 to fully emulate a PICC card. In these situations, the test signal control loop would include a path to control circuit 907 in order for external control system 910 to cause device 902 to initiate an exchange with antenna 913. In some approaches, an entire loop back communication protocol could be emulated by external control system 910 in order to simulate a full NFC exchange between device 902 and a PICC card.

Flow chart 1000 includes a measuring step 1002 in which a performance metric of the filter is measured. The performance metric can be any value which generally indicates the goodness of reception of device 902 attributable to the performance of filter 901. In specific approaches, the metric is the magnitude of the detected signal in decibels compared to what would be expected from a known sequence of communication between the device under test and the external circuitry. The performance metric can include a measurement made by control circuit 907 that is not otherwise a part of the operation of device 902. In other words, the performance metric feedback path can be independent of the normal operation of the device. For example, the performance metric can involve the voltages read by circuits 810 and 810' in device 800 which provide a sample of the filtered signal itself directly at the output of the filter. However, the performance metric could also be derived from a signal that is generated in the ordinary course of operation for device 902. For example, the performance metric could be derived from a transmission successful signal that is ordinarily produced by receiver 905 in order to send an acknowledgement back to a transmitting device. As another example, the performance metric could be a number of successful packets retrieved in a certain amount of time, a pass or fail determination made in response to a signal of diminishing intensity transmitted by test device 910, the magnitude of a received signal in response to a signal of set intensity transmitted by test device 910, or a pass or fail determination that is determined by detecting a signal that only arises in receiver 905 when a successful communication has been achieved. Finally, the performance metric could be a pass or fail determination for a loop back communication procedure between the proximity coupling device and the proximity inductive coupling card. The measuring step could also involve a performance metric that is measured using multiple iterations of a specific test. For example, the performance metric could be a pass or fail determination for 3 consecutive polling loops as required by a particular contactless communication protocol specification.

Flow chart 1000 also includes steps 1003 and 1004. In step 1003, a filtered signal is generated based on a test signal using the filter. In step 1004, a digital signal is generated based on the filtered signal using a processing circuit. Step 1003 includes a method input node to indicate that step 1003 can proceed without step 1001. The filtered signal generated in step 1003 can be a filtered version of an input signal transmitted from test system 910 using antenna 913. The filtered signal can be produced using a filter such as filter 901. The filter can include an LC tank and can in general exhibit all of the characteristics described above with reference to FIGS. 3-8. The processing circuit used to generate the digital signal in step 1004 based on the filtered signal from step 1003 can be a part of receiver 905 or it can be control circuit 907. The digital signal generated in step 1004 can be used to derive a performance metric for the filter, or it could be the performance metric itself. For example, the digital signal could be a representation of the filtered signal, an indicator of a characteristic of the filtered signal, or a signal that is generated by device 902 in ordinary operation. Step 1003 is shown as being connected directly to measuring step 1002 because in some approaches, generation of the digital signal based on the filtered signal is not essential in order to measure the performance metric. When measuring step 1002 involves the evaluation of a digital signal, that digital signal can be the digital signal generated in step 1004.

Flow chart 1000 also includes trimming steps 1005 and 1006. Step 1005 involves trimming a pass band frequency of the filter. Step 1006 involves trimming an input signal magnitude of the filter. Step 1005 can involve a control signal sent from external control circuit 911 to control circuit 907. This control signal can be a digital signal that is converted by a DAC in control circuit 907 to be applied to a trimming circuit in trim circuit 903 such as the first trimming circuits described above with reference to FIGS. 3-8. As such, step 1005 can involve adjusting the capacitance of an LC tank circuit in approaches in which filter 901 is an LC tank. Step 1006 can also involve a control signal sent from external control circuit 911 to control circuit 907. This control signal can be a digital signal that is converted by a DAC in control circuit 907 to be applied to a trimming circuit in trim circuit 903 such as the second trimming circuits described above with reference to FIGS. 3-8. As such, step 1006 can involve adjusting a voltage applied across an LC tank circuit in approaches in which filter 901 is an LC tank.

Steps 1005 and 1006 can be conducted by applying a trim code to control circuit 907. The trim code can be determined using measuring step 1002. The trim code can then be stored in NVM on the device, such as flash, fuse, or antifuse memory so that it is available when the device is deployed and the external control system is no longer available. The trim code that is applied to the device can be stored in EEPROM so that it can be revised at a later date when the device has been in use for a period of time. The behavior of the device may change as it ages which may shift the transfer function of the filter. To compensate for this shift, the trim code can be recalculated and adjusted as the device ages.

Flow chart 1000 includes two loops back from trim steps 1005 and 1006 because the tuning procedure can be iterative. In other words, the measuring step 1002 is conducted after trimming the pass band of the filter in step 1005 and trimming the magnitude of the filter in step 1006, and these steps can be repeated any number of times until the filter is tuned for a first physical test condition. Step 1002 includes a method termination node to indicate that when the filter is determined to be adequately tuned during an iteration of step 1002, the method terminates. Both trimming steps 1005 and 1006 can be conducted using commands sent from external control circuit 911. A single command can be utilized for both trimming steps, or separate commands can be utilized. Regardless, control circuit 807 is able to trim both parameters separately. Each iteration of steps 1005 and 1006 can be conducted by sweeping a trim code used to tune filter 901. The direction in which the trim codes for steps 1005 and 1006 are adjusted can be in the same direction or inverse, and the direction of the sweep can be based on the measurement in step 1002.

A specific testing procedure that can be used for each round of testing involves sweeping the input variable that affects the center frequency of the transfer function while adjusting the magnitude of the input signal at each stage of the sweep to place the magnitude of the input signal at a predetermined optimal level. In specific approaches, this will involve adjusting the center frequency one step, and then adjusting the peak-to-peak magnitude of a differential signal to match the predetermined optimal level.

In specific approaches, device 902 will include a seal such that it can be referred to as a sealed device. In addition, the components of device 902 would then comprise a set of sealed components. Any combination of filter 901, receiver 905, control circuit 907, and the first and second trimming circuits of trim circuit 903 could be in the set of sealed components. The benefit of trimming device 902 in this configuration is that the filter 901 would not shift its characteristics further down the manufacturing line from the point at which it was tuned. Since the addition of additional components in proximity to filter 901 can introduce parasitic inductors or capacitors to alter the transfer function of 901, trimming after all of such potential sources of parasitics have already been added assures that the tuning procedure will provide a trim code that functions properly when the device is deployed.

Port 908 allows external control system 911 to tune the device in its final state. In addition, since in some approaches device 902 will have a processing circuit that can generate a digital signal that is representative of the performance of the filter, there is no need to physically contact the nodes of the filter in order for these disclosed tuning procedures to be successful. This is in stark contrast to other approaches in which a vector network analyzer is used to tune a filter, as such a device requires direct contact to the physical nodes of the filter.

In certain approaches the sealed product will be a POS terminal used to conduct NFC communications. For example, device 902 could be a PCD device with a touch screen display having a surface to receive a touch input. Filter 901 and antenna 904 could be behind the display within an area encompassed by the surface of the device. Furthermore, external control system 910 could emulate a PICC and the test device could be used for determining the performance of the device by determining if a successful NFC loop back protocol was conducted between the device and the emulated PICC. These specific approaches provide additional benefits because such POS terminals often include a tamper resistant seal that introduces still further alterations to the transfer function of the filter and make contacting the physical nodes of the filter near impossible. Utilizing a testing system that does not require physical connections beneficially allows the device to be tuned even once the device is placed in a tamper resistant seal that would otherwise prevent filter tuning and introduce additional non-idealities to the filter's transfer function.

Tuning System with Multiple Physical Conditions

Specific methods and systems for tuning filters are disclosed as follows with reference to FIGS. 11-13. The devices that are tuned using these methods and systems can be in accordance with the devices disclosed above. The methods and systems generally refer to trimming a filter for multiple physical test conditions. In each of the physical test conditions, a tuning procedure such as the one described with reference to FIGS. 9-10 can be conducted. The systems and methods involve the automated alteration of the physical test condition under which the tuning procedure is conducted in order to find the optimal tuning code for the filter to meet a performance specification that includes multiple physical test conditions. For example, particular contactless communication protocol specifications include testing conditions for various card types, card qualities, and card locations. Repeating the tuning procedure for multiple test conditions therefore assures that the ultimate trim code that is selected for device deployment will allow the device to pass the specification regardless of which test is applied.

Figure 11:
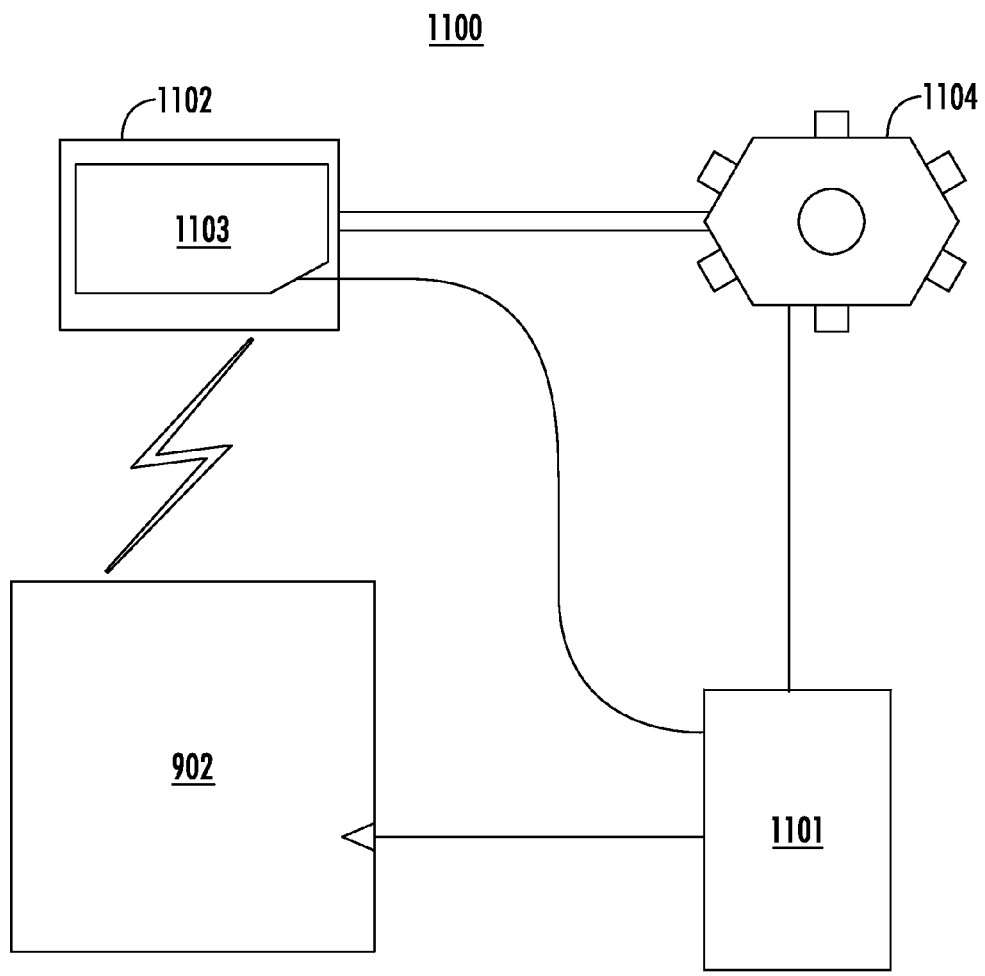
FIG. 11 illustrates a block diagram of a system for tuning a filter.

FIG. 11 is a block diagram of a system 1100 for tuning a filter. System 1100 includes a device under test 902. The device in this instance is a PCD that includes a filter with a trimming circuit. The trimming circuit is under the control of a first control system located in external control system 1101. External control system 1101 is part of a test device that includes holder 1102 for a transmitting device 1103 and a motor 1104. Transmitting device 1103 is used to transmit signals to device under test 902 under the control of control system 1101. As such, control system 1101 allows transmitting device 1103 to emulate various transmitting devices. The first control system in 1101 can be external control circuit 911 from FIG. 9. In addition, external control system 1101 includes a second control system that is in operative communication with motor 1104. As such, the second control system allows the test device to automatically alter the position of holder 1102 from a first physical test condition to a second physical test condition. For example, motor 1104 could alter the position of transmitting device 1103 from 5 cm away from device under test 902 to 10 cm away from device under test 902.

The first control system is utilized to control the method described with reference to flow chart 900 while the second control system is utilized to control the method described below with reference to FIG. 12. As such, the two control systems are conceptually separate. However, the control systems can be physically very similar. Indeed, in certain approaches the same physical hardware and software could instantiate both control systems. For example, the second control system and first control system could be nested loops within a single state machine. However, the two control systems could be separate and have completely different user interfaces so long as the second control system was capable of automatically altering the position of holder 1102 relative to device under test 902 at the termination of one iteration of method 1000.

Figure 12:
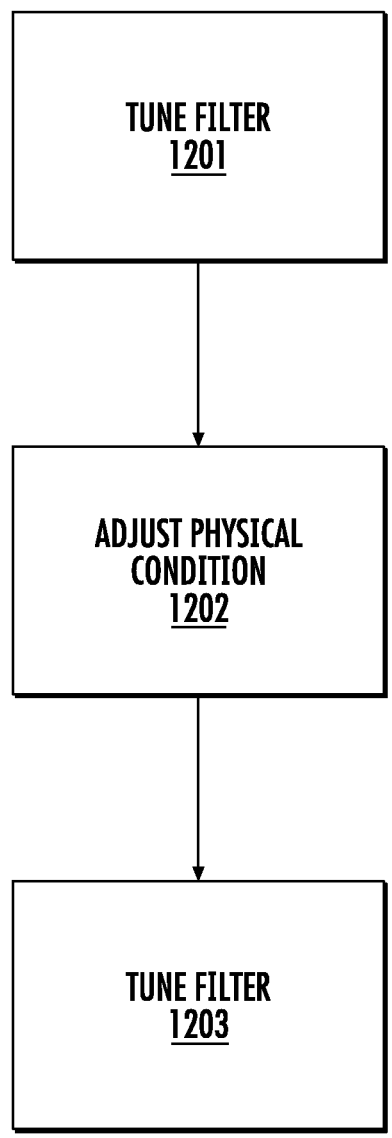
FIG. 12 illustrates a flow chart of a set of methods for tuning a filter in various physical test conditions.

FIG. 12 is a flow chart 1200 that can be used to describe a set of methods that can utilize a system such as system 1100 in FIG. 11. The flow chart includes a step 1201 in which a filter is tuned for a first physical test condition. The tuning procedure in step 1201 can be conducted in accordance with any of the methods represented by flow chart 1000. Flow chart 1200 continues with step 1202 in which the position of the transmitting device is automatically adjusted to create a second physical test condition for the filter. In step 1203, a second iteration of any one of the methods represented by flow chart 1000 is conducted to tune the filter again. In addition, multiple runs of the filter tuning procedure can be conducted between the automatic adjustment of the position of transmitting device 1103 relative to device under test 902 as a different physical test condition can be created by altering the electrical characteristics of the device that is emulated by transmitting device 1103.

The physical test condition to which the device under test is automatically adjusted can be selected a priori by a user. Indeed, an entire sequence of physical test conditions can be selected a priori and stored for later use. The process is automated not in that the physical test conditions are selected automatically, but that the transition between the various tests can be conducted without user intervention once the test procedure has been put into motion. In an assembly line producing thousands of devices in which each needs to be tuned for various physical conditions, automating the process provides a significant savings in time as compared to one in which the devices are each tuned by hand or one in which a user needs to manually adjust the position of the device between automated runs of a testing procedure.

The automated testing procedure can be conducted for various performance corners for which the filter is meant to operate. The automated testing procedure is performed for each performance corner in sequence, and is tuned again at each step. Benefits accrue to approaches in which the sequence moves from the least to most stringent performance corner. The automated testing procedure can also be repeated for specific performance corners. The overall tuning procedure can also include a final measurement for each of the performance corners, and the automated testing procedure can be repeated for the corners that failed this final measurement. The final measurement and revisiting of specific performance corners can be repeated until all of the performance corners pass the final measurement.

The testing structure can position the transmitting device at various locations with respect to the device under test in order to conduct different tests. In the case of tuning a filter for NFC operations according to a given specification, this involves adjusting the location of the emulated PICC relative to the PCD in accordance with the specification and emulating the type of card and card quality required by the specification. In particular, the testing structure can place the testing device at different heights away from the device under test as well as different offsets from the antenna of the device under test. The testing structure can also include a signal generator to emulate the response of a PICC to a signal sent from the PCD without the PCD needing to send a signal out to the PICC. As such, the testing structure can exhibit the behavior of PICCs having different characteristics. The testing structure can also include an external test computer that can receive measurements from the PCD for a given test, send commands to tune the filter on the PCD for a given test, instruct the PICC emulator regarding which signals it should transmit to the PCD, and adjust the characteristics of the PICC from one test to another.

Particular performance corners can be selected from a set of performance corners that the device is being designed for. In particular, the most stringent tests from a set of tests can be selected if it is determined that they provide an adequate proxy for the full barrage of tests for which the device must be specified to operate. In the case of tuning a filter for a particular contactless communication protocol specification, specific requirements can be selected from the overall specification for which adequate performance provides sufficient confidence as to the filter's overall ability to meet the specification. For example, some of the more stringent performance corners include a weak card at 2 cm distance from the device and 2.5 cm offset from the center of the logo that is intended to mark alignment for a user of the NFC reader. As another example, the minimum negative load modulation test and minimum positive load modulation tests specified by certain contactless communication protocol specifications are also particularly strenuous because they usually require the receiver to be highly sensitive in order to pick up signal from the carrier and ambient noise (the carrier voltage has a magnitude of 25 V peak-peak, while the applied load-modulated signal can be as low as 3.5 mV in magnitude). Depending upon the coupling between specific types of PCD and PICC, other tests and locations may prove more appropriate for tuning of filter.

Figure 13:
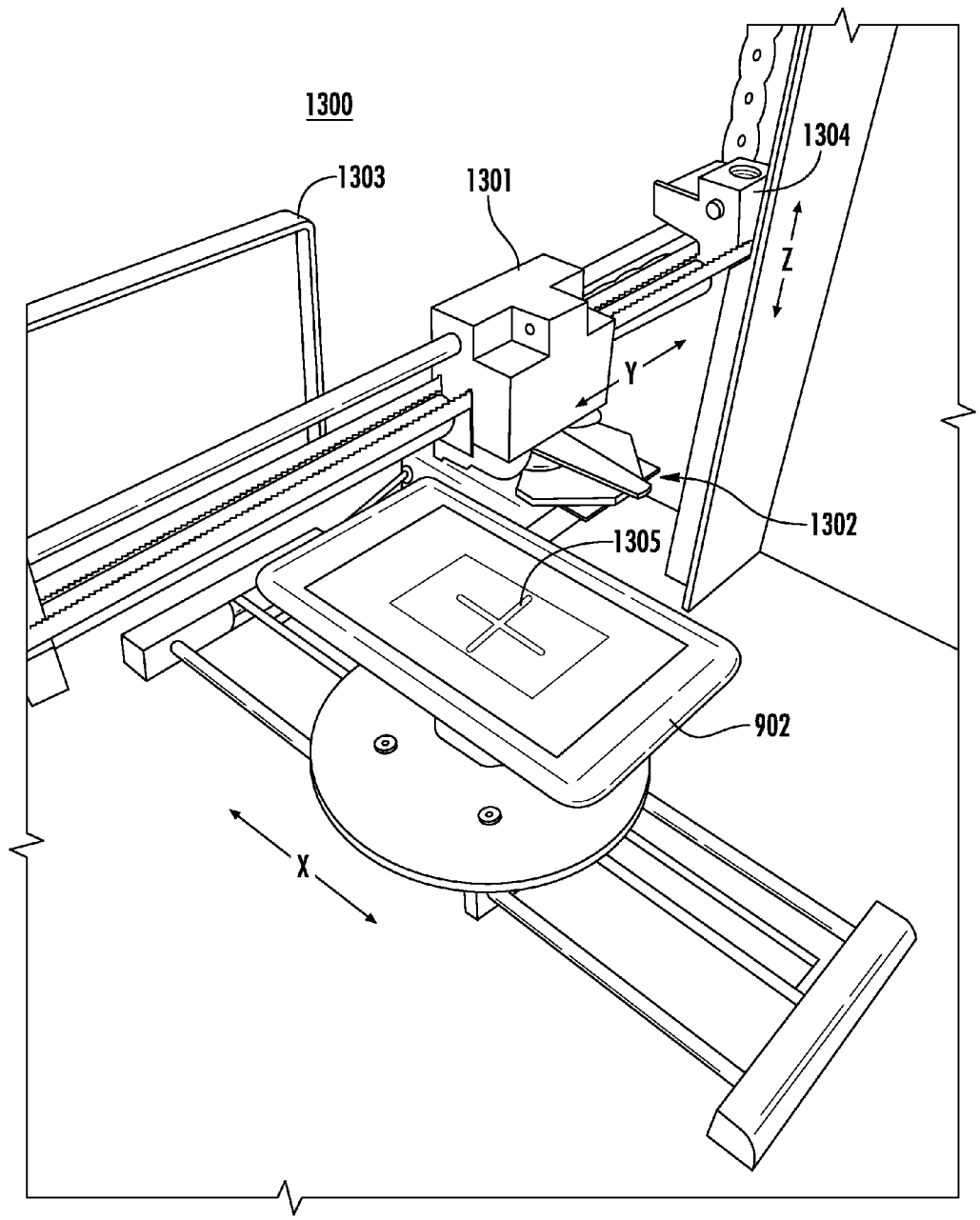
FIG. 13 illustrates a system for tuning a filter in various physical test conditions.

FIG. 13 illustrates a scale image of test device 1300 for tuning filters in accordance with method 1200. Test device 1300 includes a holder 1301 for transmitting device 1302 which can take on the characteristics of antenna 813 or external control system 810. In FIG. 13, transmitting device 1302 takes on the characteristics of antenna 813, as FIG. 13 also includes a signal generator and external control circuit 1303. The device under test 902 in test device 1300 can take on any of the characteristics of device 902 in FIG. 9. Holder 1301 is capable of 4-axis movement relative to device under test 902 (x, y, z, and azimuth). Test device 1300 also includes a motor 1304 to transfer holder 1301 from a first physical test condition to a second physical test condition. The test device can include a set of separate motors for different ranges of motion. As described above, test device 1300 includes a second control system in operative communication with the motor 1304 and the first control system in order to cause the motor to alter the physical test condition of device under test 902. In particular examples, the different physical test conditions place transmitting device 1302 at certain distances along the z direction and different offsets along the x and y directions relative to the contactless communication logo 1305.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the scope of the present invention, which is more particularly set forth in the appended claims.

What is claimed is:

1. A method for tuning a filter in a sealed proximity coupling device comprising the steps of:
   trimming, using a first trimming circuit and an external control circuit, a center frequency of the filter, wherein the first trimming circuit is located inside the sealed proximity coupling device and the external control circuit is located outside the sealed proximity coupling device;
   trimming an input signal magnitude of the filter using a second trimming circuit, wherein the second trimming circuit is located inside the sealed proximity coupling device;
   measuring a performance metric of the filter after trimming the center frequency of the filter and the input signal magnitude of the filter;
   repeating the trimming steps and the measuring step until a trim code is obtained that tunes the filter for a first physical test condition; and
   storing, after the filter is tuned, the trim code for the filter on a nonvolatile memory in the sealed proximity coupling device;
   wherein the sealed proximity coupling device applies the trim code to at least one of the first and second trimming circuits.

2. The method of claim 1, wherein:
   the filter includes an LC tank;
   trimming the center frequency involves adjusting a capacitance of the LC tank; and
   trimming the input signal magnitude involves adjusting a voltage applied across the LC tank.

3. The method of claim 1, further comprising:
   generating, using the filter, a filtered signal based on a test signal; and
   generating, using a processing circuit, a digital signal based on the filtered signal;
   wherein the filter and the processing circuit are separate components in a set of internal components of the sealed proximity coupling device; and
   wherein measuring the performance metric involves evaluating the digital signal.

4. The method of claim 1, further comprising:
   transmitting a first test signal to the sealed proximity coupling device from a transmitting device after the first physical test condition has been created;
   automatically adjusting a position of the transmitting device to create a second physical test condition for the filter;
   transmitting a second test signal to the sealed proximity coupling device from the transmitting device after the second physical test condition has been created; and
   repeating the trimming steps and the measuring step until the filter is tuned for the second physical test condition.

5. The method of claim 4, wherein:
   the transmitting device emulates a proximity inductive coupling card; and
   the performance metric is a pass or fail determination for a loop back communication procedure between the sealed proximity coupling device and the proximity inductive coupling card.

6. The method of claim 1, further comprising:
   transmitting a test signal to the sealed proximity coupling device from a transmitting device after the first physical test condition has been created;
   wherein the measuring is conducted by the external control circuit;
   wherein the trimming of the center frequency is conducted using a command from the external control circuit; and
   wherein the trimming of the input signal magnitude is conducted using a separate command from the external control circuit.

7. The method of claim 6, wherein:
   the filter is sealed in a tamper resistant portion of the sealed proximity coupling device.

8. The method of claim 6, wherein:
   the trimming of the center frequency is conducted using a first digital to analog converter;
   wherein the first digital to analog converter is in a set of sealed components of the sealed proximity coupling device.

9. The method of claim 8, wherein:
   the trimming of the center frequency is conducted using a varactor with a capacitance that is set by the first digital to analog converter.

10. The method of claim 8, wherein:
    the trimming of the input signal magnitude is conducted using a variable capacitor bank.

11. A sealed proximity coupling device comprising:
    a receiver sealed in the sealed proximity coupling device;
    a filter, sealed in the sealed proximity coupling device, that filters an input signal for the receiver;
    an input for a first external control signal from an external control circuit outside the sealed proximity coupling device to set a trim code on the sealed proximity coupling device via a performance metric feedback path;
    a first trimming circuit, sealed in the sealed proximity coupling device, that trims a center frequency of the filter, wherein the first trimming circuit is controlled by the trim code;
    a second trimming circuit, sealed in the sealed proximity coupling device, that trims an input signal magnitude for the filter; and
    a nonvolatile memory, sealed in the sealed proximity coupling device, that stores the trim code.

12. The device of claim 11, further comprising:
    an LC tank that is included in the filter;
    wherein the first trimming circuit includes a first adjustable capacitance; and
    wherein the second trimming circuit includes an adjustable voltage divider.

13. The device of claim 11, further comprising:
    a processing circuit, sealed in the sealed proximity coupling device, that generates a digital signal based on a filtered signal;
    wherein the filter generates the filtered signal by filtering the input signal.

14. The device of claim 11, further comprising:
    a transceiver, sealed in the sealed proximity coupling device, consisting of the receiver and a transmitter;
    wherein the transceiver is a near field communication transceiver.

15. The device of claim 11, further comprising:
a touch screen display having a surface to receive a touch input; wherein the filter is located beneath the display within an area encompassed by the surface.

16. The device of claim 11, wherein:
the sealed proximity coupling device is sealed with a tamper resistant seal.

17. The device of claim 11, further comprising:
a first digital to analog converter, sealed in the sealed proximity coupling device, that receives the first external control signal and controls the first trimming circuit;
wherein the second trimming circuit is a variable capacitor bank that receives a second external control signal; and
wherein the first digital to analog converter and the capacitor bank are in the set of internal components.

18. The device of claim 17, further comprising:
a varactor with a capacitance that is set by the first digital to analog converter;
wherein the first trimming circuit includes the varactor.

19. The device of claim 17, wherein:
the first digital to analog converter is part of a microcontroller; and
the second external control signal is provided via a GPIO pin of the microcontroller.

20. A system comprising:
a filter in a sealed proximity coupling device;
a first trimming circuit for the filter configured to trim a center frequency of the filter;
a test device with: (i) a holder for a transmitting device; and (ii) a motor to transfer the holder from a first physical test condition to a second physical test condition;
a first control system with a performance metric feedback path which includes an external control circuit outside the sealed proximity coupling device, wherein the first control system is in operative communication with the first trimming circuit, and wherein the first control system provides a trim code to the sealed proximity coupling device;
a second trimming circuit configured to trim an input signal magnitude of the filter;
a nonvolatile memory in the sealed proximity coupling device to store the trim code; and
a second control system in operative communication with the motor and the first control system.

21. The system of claim 20, wherein:
the filter includes an LC tank;
the first trimming circuit includes a varactor; and
the second trimming circuit includes an adjustable voltage divider.

22. The system of claim 20, further comprising:
a set of internal components that are sealed in the sealed proximity coupling device; and
a processing circuit that is in operative communication with the filter and that has a digital signal output;
wherein the digital signal output is on the performance metric feedback path; and
wherein the set of internal components includes the filter and the processing circuit.

23. The system of claim 22, wherein:
the transmitting device is a proximity inductive coupling card emulator; and
the processing circuit is configured to output a pass or fail determination for a loop back communication procedure between the sealed proximity coupling device and the proximity inductive coupling card emulator using the digital signal output.

24. The system of claim 20, further comprising:
a set of internal components that are sealed in the sealed proximity coupling device; and
an input on the sealed proximity coupling device for an external control signal from the first control system;
wherein the external control signal controls the first trimming circuit; and
wherein the set of internal components includes the filter and the first trimming circuit.

25. The system of claim 24, wherein:
the set of internal components are sealed in a tamper resistant seal.

26. The system of claim 24, further comprising:
a first digital to analog converter in operative communication with the input on the sealed proximity coupling device and the first trimming circuit;
a variable capacitor bank in operative communication with the first control system;
wherein the set of internal components includes the first digital to analog converter and the variable capacitor bank; and
wherein the second trimming circuit includes the variable capacitor bank.

27. The system of claim 26, further comprising:
a first varactor with a capacitance that is set by the first digital to analog converter;
wherein the first trimming circuit includes the first varactor.

28. The system of claim 27, wherein
the second trimming circuit is controlled via a GPIO pin.

\* \* \* \* \*